(12) United States Patent
Kleshock et al.

(10) Patent No.: US 7,182,816 B2
(45) Date of Patent: Feb. 27, 2007

(54) PARTICULATE REDUCTION USING TEMPERATURE-CONTROLLED CHAMBER SHIELD

(75) Inventors: Mark Kleshock, Phoenix, AZ (US); Jacques Faguet, Gilbert, AZ (US); Tim Provencher, Gilbert, AZ (US)

(73) Assignee: Tokyo Electron Limited, Tokyo (JP)

( * ) Notice: Subject to any disclaimer, the term of this patent is extended or adjusted under 35 U.S.C. 154(b) by 265 days.

(21) Appl. No.: 10/643,136

(22) Filed: Aug. 18, 2003

(65) Prior Publication Data
US 2005/0039679 A1  Feb. 24, 2005

(51) Int. Cl.
| C23C 16/00 | (2006.01) |
| C23C 14/00 | (2006.01) |
| C23F 1/00  | (2006.01) |
| C25B 9/00  | (2006.01) |
| C25B 11/00 | (2006.01) |
| C25B 13/00 | (2006.01) |
| H01L 21/306 | (2006.01) |

(52) U.S. Cl. ............ 118/715; 204/298.11; 156/345.3; 156/916

(58) Field of Classification Search ........... 156/345.3; 118/715
See application file for complete search history.

(56) References Cited

U.S. PATENT DOCUMENTS

| 5,518,593 | A  | * | 5/1996  | Hosokawa et al. | .... 204/192.12 |
| 5,951,775 | A  | * | 9/1999  | Tepman          | ........ 118/729 |
| 6,080,287 | A  |   | 6/2000  | Drewery et al.  |                  |
| 6,197,165 | B1 |   | 3/2001  | Drewery et al.  |                  |
| 6,287,435 | B1 | * | 9/2001  | Drewery et al.  | ....... 204/298.09 |
| 6,312,568 | B2 | * | 11/2001 | Wilke et al.    | ........ 204/192.18 |
| 6,417,626 | B1 |   | 7/2002  | Brcka et al.    |                  |
| 6,583,064 | B2 |   | 6/2003  | Wicker et al.   |                  |
| 6,627,050 | B2 | * | 9/2003  | Miller et al.   | ........ 204/192.22 |
| 6,837,974 | B2 |   | 1/2005  | Lawson et al.   |                  |
| 6,893,541 | B2 |   | 5/2005  | Chiang et al.   |                  |
| 2002/0104751 | A1 | * | 8/2002  | Drewery et al.  | ......... 204/192.1 |
| 2004/0020759 | A1 | * | 2/2004  | Lawson et al.   | .......... 204/192.1 |
| 2004/0031680 | A1 | * | 2/2004  | Miller et al.   | ........... 204/298.11 |
| 2004/0094402 | A1 | * | 5/2004  | Gopalraja et al. | ...... 204/192.12 |
| 2004/0140196 | A1 | * | 7/2004  | Gopalraja et al. | ...... 204/192.12 |
| 2004/0173155 | A1 | * | 9/2004  | Nishimoto et al. | ......... 118/715 |
| 2004/0245098 | A1 | * | 12/2004 | Eckerson        | ............... 204/298.01 |
| 2005/0199489 | A1 | * | 9/2005  | Stevens et al.  | ........... 204/275.1 |
| 2005/0199491 | A1 | * | 9/2005  | Gung et al.     | ............ 204/298.11 |

* cited by examiner

*Primary Examiner*—Ram Kackar
*Assistant Examiner*—Rakesh K. Dhingra
(74) *Attorney, Agent, or Firm*—Wood, Herron & Evans, L.L.P.

(57) ABSTRACT

Particle flaking is reduced in a semiconductor wafer processing apparatus by installing a chamber shield assembly in the chamber of the apparatus. The shield assembly includes a plurality of nested shields that are supported out of contact with each other and suspended such that, during thermal expansion and contraction, gaps are maintained that are sufficient to avoid arcing. Alignment structure on the shields and on the chamber walls force the shields to align concentrically and maintain the gaps. The shields are made of aluminum or another thermally conductive material and have cross-sectional areas large enough to provide high thermal conductivity throughout the shields. Mounting flanges and other mounting surfaces are provided on the shields that form intimate thermal contact with sufficient contacting area to insure high thermal conductivity from the shields to the temperature controlled walls of the chamber. Radiant lamps of an array are spaced around the chamber and extend vertically to expose multiple shields across large areas to heat for pre-heating bake-out of the shields and to eliminate thermal shock upon processing the first wafer of a run.

27 Claims, 15 Drawing Sheets

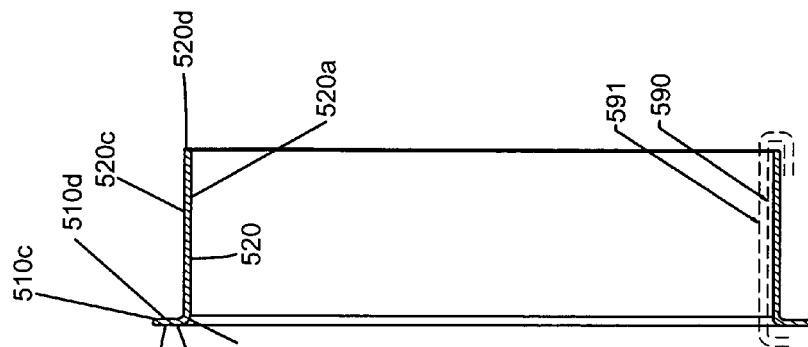
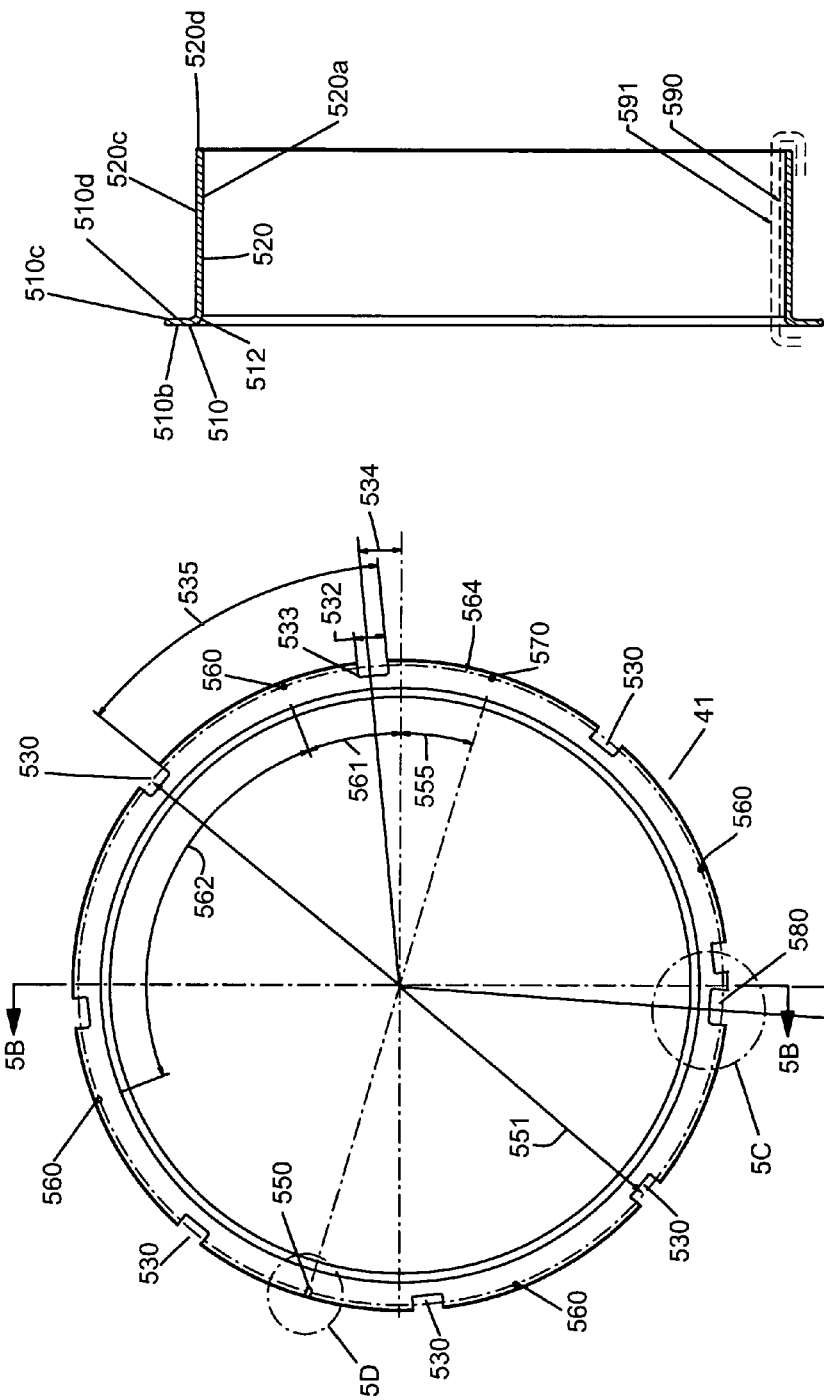
FIG. 5B
FIG. 5A

PARTICULATE REDUCTION USING TEMPERATURE-CONTROLLED CHAMBER SHIELD

This invention is related to U.S. Pat. Nos. 6,080,287; 6,197,165 and 6,287,435 and to pending U.S. patent application Ser. No. 09/796,971, filed Mar. 1, 2001, all hereby expressly incorporated by reference herein.

FIELD OF THE INVENTION

This invention relates to the manufacture of semiconductor wafers and to the reduction of particulate contamination in semiconductor wafer manufacturing processes. More particularly, the invention relates to shields provided to protect the walls of processing chambers from depositions and to the reduction of contamination caused by the flaking of deposits from such chamber shields.

BACKGROUND OF THE INVENTION

Semiconductor wafer manufacture includes processes by which thin films or layers of material are built up and etched on the surfaces of wafer substrates, usually in vacuum processing chambers where materials are deposited or etched by chemical or plasma processes. One of the greatest causes of losses in the manufacture of semiconductors is contamination by minute particles. With the trend toward increased miniaturization in semiconductor design, the presence of a particle on the surface of a wafer can render an entire device inoperative. Accordingly, control of particle production in manufacturing processes is continually increasing in importance.

In vacuum processes, particularly deposition processes, in which material vapors result in the formation of coatings on chamber walls and other internal reactor parts that are in contact with the processing medium, the build up and eventual flaking of the coatings is a major source of contamination of semiconductor wafers by particles. Reduction of the tendency for such deposits to flake is thus a major goal of processing equipment and process design. Chamber shields that are employed to intercept deposits from forming on permanent chamber surfaces become particle sources that are a focus of particle contamination prevention efforts. Frequent replacement and cleaning of such shields is a solution to the flaking problem, but such a solution itself subtracts from the productivity of the processing equipment and manufacturing process. Accordingly, ways to use such shields in a way that increases their ability to retain deposits for longer times without flaking are constantly needed.

Making chamber shields more resistant to flaking has included efforts to condition the surfaces of shields to increase the adhesion of the deposits that they collect. Still, flaking occurs eventually if the shields are not frequently removed or cleaned. Process conditions have been observed as aggravating the flaking phenomenon. Mechanical contact, gas flow, and pressure and thermal cycling of parts are among the parameters that cause the coatings to flake off of the shields.

Accordingly, needs remain for ways to improve the ability of shields in semiconductor wafer processing chambers to retain deposits without flaking.

SUMMARY OF THE INVENTION

An objective of the present invention is to reduce particle generation in semiconductor wafer vacuum processing. A particular objective of the invention is to minimize flaking from the shields provided in vacuum processing chambers to protect permanent chamber components from the accumulation of deposits in semiconductor wafer processing systems.

According to principles of the present invention, chamber shields in a semiconductor wafer processing chamber are temperature controlled in a way that minimizes the flaking of particles from their surfaces as a result of thermal stresses and process-induced thermal cycling.

According to the certain aspects of the present invention, chamber shields are provided that have high thermal conductivity within the shield components and with high thermal conductivity structure for mounting the shields to a thermally cooled chamber wall. These features promote thermal uniformity of the shields, particularly in combination, and reduce shield temperature and temperature concentrations due to energy from the processing within the chamber.

In certain embodiments of the invention, the high thermal conductivity structure for mounting the shields to the chamber wall includes a mounting surface having a greater area than the cross section of the shield to form intimate contact with the chamber wall and provide a thermal conductivity from the shield to the chamber wall that is at least as great as the thermal conductivity through the shield. Each of a plurality of shield components of a multiple shield assembly is provided with the highly thermally conductive mounting structure.

In the illustrated embodiment, each of the shields of an assembly is symmetrical around a central axis that would align with the axis of the chamber in which the shield assembly is mounted. In such an embodiment, the mounting surface area between each shield component and the chamber wall or other heat-sinking, supporting structure to which the component is mounted is preferably greater than the cross-sectional area of the shield in a plane through the shield perpendicular to the axis of the shield. This mounting surface is secured in intimate contact with the chamber wall or supporting structure so that the thermal conductivity to the wall or supporting structure from the shield through the mounting surface is at least as great as the thermal conductivity across this cross-sectional area of the shield.

According to certain features of the invention, critical dimensions and critical gaps are accurately established and maintained to compensate for thermal expansion. The gaps are located so that dimensional changes take place where they are less critical, thereby avoiding increased likelihood of arcing.

According to such features of the invention, arc likelihood is reduced by the improved control of critical dimensions and critical gaps that the invention provides. These dimensions are preferably improved by more concentric location of the susceptor relative to the chamber as the result of locating pins and forced vertical travel of the source and chamber cover relative to the chamber. Reference or zero registration points for the mounting of the chamber shields allows minimum change in critical dimensions when the shields are subjected to thermal cycling, and allows thermal expansion to be taken up in non-critical locations. Accordingly, thermally caused dimension changes do not increase the likelihood of arcing. Further, the thermal expansion of the shields is kept low and more uniform by the improved cooling of the shields, which reduces the closing of critical gaps by thermal expansion.

According to other features of the invention, lamps or other thermal sources are located so as to uniformly warm chamber shield components. When used for preheating or degassing of the shields, the improved thermal conduction of the shields allows their heating at higher temperatures without affecting the process. In the illustrated embodiments, vertically or axially oriented quartz lamps expose all chamber shield components to thermal radiation. Preheating of the chamber can be carried out with these lamps to minimize the initial shock when the first wafer of a run is processed.

Such features of the invention have the advantage of more uniformly heating the chamber shields during chamber preheating, degassing or "bake-out", and allow the chamber shields to be heated above the process temperature of the processing space due to the improved thermal conductance of heat energy out of the shields, thereby facilitating more effective degassing of the shields.

Providing improved contact between the chamber shields and the chamber wall improves electrical as well as thermal conductivity between the shields to the heat-sinked and grounded chamber wall. This stabilizes the RF ground potential on the shields, providing for more stable and predictable DC voltage on the target and RF potential of the plasmas inside of the processing chamber.

Reducing the overall temperature of the shields stabilizes the process pressure within the chamber for a given gas flow. Since deposition process performance is highly dependant on process pressure, process stability from run to run is enhanced. Process pressure is affected by the temperature of the chamber shields in two ways. First, the process gas is directly heated within a constant volume of the chamber, and second, indirectly by closing the various gaps that control the gas flow out of the process space as a result of thermal expansion of the chamber shields. Further, the effect on gas flow out of the process space affects the perceived pressure due to its being monitored from outside of the process chamber, thereby causing a difference between the actual and monitored process pressure.

Furthermore, the more thermally conductive shield has less weight than prior shields improving handling and reducing handling hardware requirements.

BRIEF DESCRIPTION OF THE DRAWINGS

These and other objectives and advantages of the present invention will be more readily apparent from the following detailed description, in which:

FIGS. 5A–5D show schematic views of a barrel shield in accordance with an embodiment of the invention.

DETAILED DESCRIPTION OF THE DRAWINGS

Figure 1:
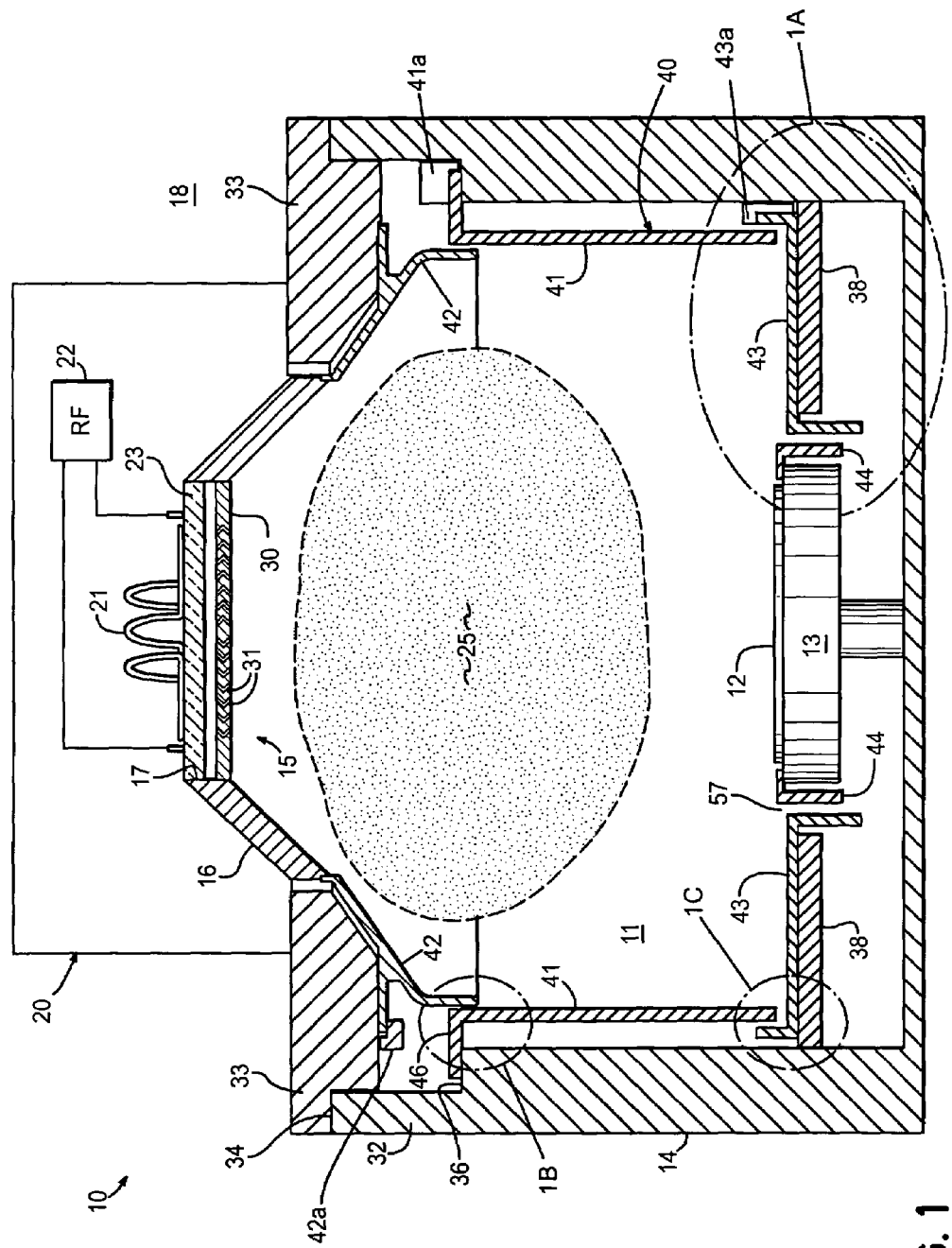
FIG. 1 is cross-sectional diagram of an Ionized Physical Deposition processing apparatus embodying principles of the present invention.

The invention is described in the context of an iPVD apparatus 10 of the type disclosed in U.S. Pat. No. 6,287,435, as diagrammatically illustrated in FIG. 1. The apparatus 10 includes a vacuum chamber 11 bounded by a chamber wall 14 and having a semiconductor wafer 12 supported for processing therein on an upwardly facing substrate support 13. An ionized sputter material source 15 is situated in the top of the chamber 11 and includes a frusto-conical magnetron sputtering target 16 with an RF energy source 20 situated in an opening 17 in the center of the target 16. The source 20 includes an RF coil or antenna 21 connected to the output of an RF power supply and matching network 22. The coil 21 is located in atmosphere 18 outside of the chamber 11, behind a dielectric window 23 that forms a part of the wall 14 of the chamber 11, which isolates a processing gas maintained at a vacuum inside of the chamber 11 from the atmosphere outside of the chamber 11. Inside of the window 23 is a deposition baffle 30 of electrically conductive material having, in the embodiment shown, a plurality of parallel linear slots 31 therethrough.

The chamber wall 14 is formed of electrically and thermally conductive metal, is cooled and grounded, so as to form a sink for heat and electrical charge. The chamber wall 14 includes a fixed lower portion 32 and a removable lid or top portion 33 which sits on the chamber wall rim 34 at the open top of the lower portion 32, where it forms a vacuum seal and a thermal and electrical flow path to the lower portion 32. The source 20 is mounted on the top portion 33 of the chamber wall 14.

The chamber 14 is a permanent part of the apparatus 10, and is lined with a removable, cleanable and replaceable chamber shield assembly 40. The shield assembly 40 protects the chamber wall 14 from deposition material originating at the target 16, ions and other particles of which emanate from the region of a high density plasma 25 in the chamber 11. The shield assembly 40 includes multiple parts, including a cylindrical sidewall or barrel shield 41 that primarily protects the sidewalls of the lower chamber wall portion 32 from deposition, an upper source shield 42 that primarily protects the chamber top portion 33 from deposition, a lower shield 43 that primarily protects the bottom of the chamber lower portion from deposition, and a susceptor shield 44 that primarily protects from deposition the peripheral portion of the susceptor 13 that surrounds the wafer 12.

In accordance with certain principles of the invention, an embodiment of the invention provides components of the shield assembly 40 that are formed of a high thermally and electrically conductive material such as aluminum that is of sufficient thickness to conduct heat and electric charge with little resistance. These components are also provided with substantial contact with the chamber wall 14 so that this heat and electric charge flows to the chamber wall 14, thereby maintaining the shield assembly 40 at low and uniform temperature and providing an effective and efficient ground to DC and RF electrical energy.

The barrel shield 41 of the shield assembly 40 has an annular outwardly extending flange 46 that supports the flange portion of the barrel shield 41 on an annular shoulder 36 on the lower portion 32 of the chamber wall 14, making a low resistance thermal and electrical connection to the chamber wall 14. For example, a plurality of clamps 41a can be used to couple the barrel shield 41 to the annular shoulder 36. The clamps can be loosened to insert and remove the barrel shield 41 and the clamps 44a can be tightened to provide the low resistance thermal and electrical connection between the barrel shield 41 and the annular shoulder 36 on the lower portion 32 of the chamber wall 14. Alternately, other fastening devices can be used.

The upper source shield 42 is fixed to the bottom of the chamber top portion 33, also thereby making a low resistance thermal and electrical connection to the chamber wall 14. For example, a plurality of clamps 42a can be used to couple the upper source shield 42 to the bottom of the chamber top portion 33. The clamps 42a can be loosened to insert and remove the upper source shield, and the clamps 42a can be tightened to provide the low resistance thermal and electrical connection between the upper source shield and the bottom of the chamber top portion 33. Alternately, other fastening devices can be used.

Figure 1A:
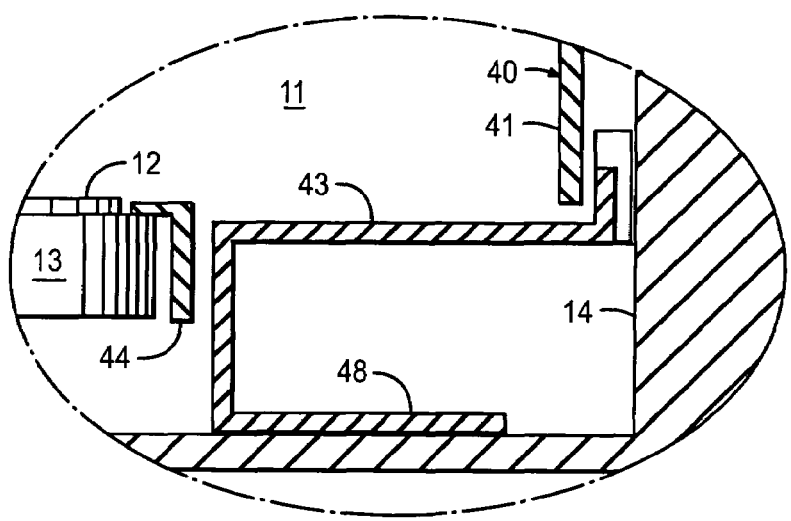
FIG. 1A is an enlarged diagram of the encircled portion of FIG. 1 so marked illustrating an alternative configuration of a portion of the shield in the apparatus of FIG. 1.

The lower shield 43 is supported on an annular ring shaped block 38 fixed to or integral with the side wall of the chamber lower portion 32, also thereby making a low resistance thermal and electrical connection to the chamber wall 14. For example, a plurality of clamps 43a can be used to couple the lower shield 43 to the chamber using block 38. The clamps 43a can be loosened to insert and remove the lower shield 43, and the clamps 43a can be tightened to provide the low resistance thermal and electrical connection between the lower shield 43 and the bottom portion of the chamber. Alternately, other fastening devices can be used. Further, this lower shield 43 may be supported on a downwardly projecting lower flange 48 to the bottom of the chamber lower portion 32, as illustrated in FIG. 1A.

The susceptor shield 44 is supported on the susceptor 13 which, although not connected to the chamber wall 14, has separate temperature and electric-potential control (not shown).

Figure 1B:
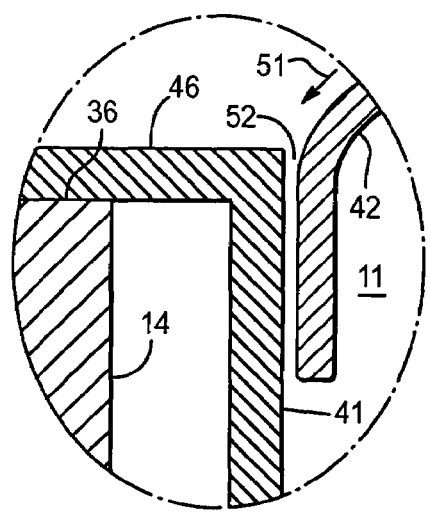
FIGS. 1B and 1C are enlarged diagrams of encircled portions of FIG. 1 so marked illustrating details of portions of the shield in the apparatus of FIG. 1.
Figure 1C:
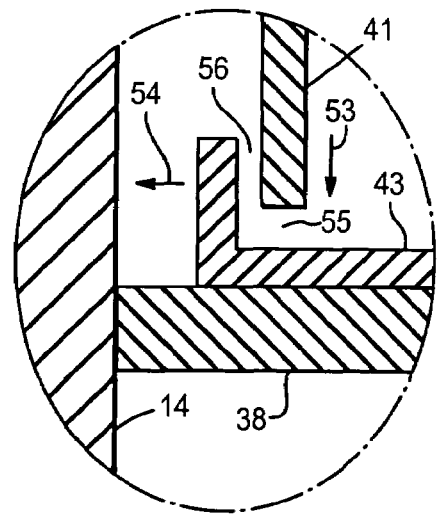
Figure 2A:
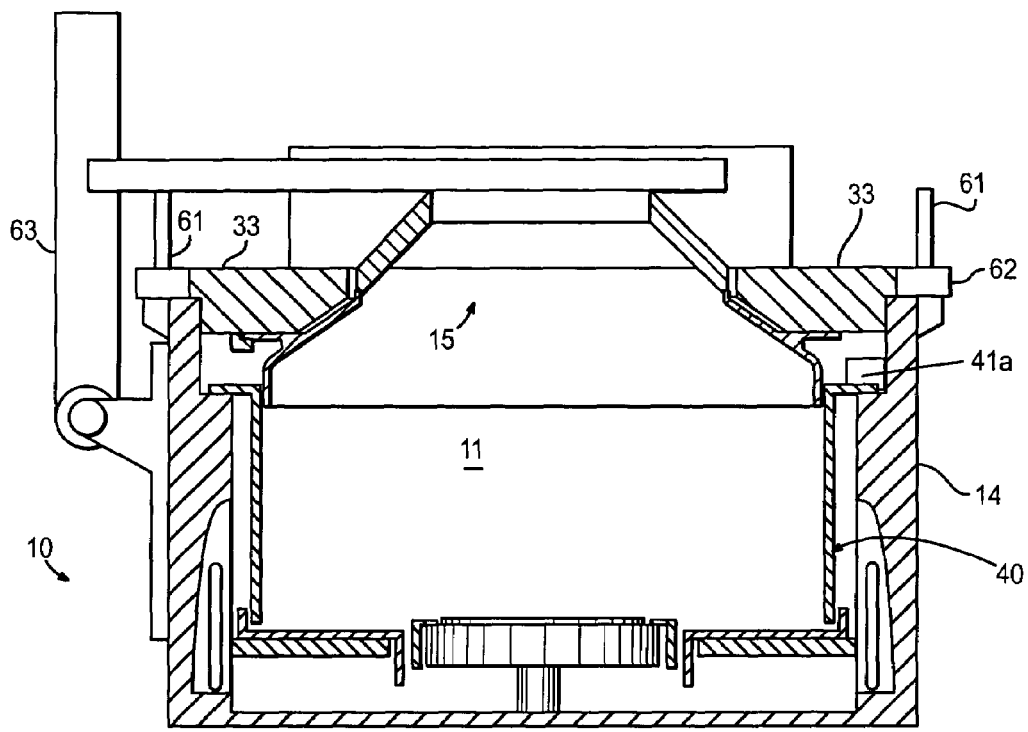
FIGS. 2A–2E is a sequence of diagrams illustrating the opening and closing of the chamber of the apparatus of FIG. 1 and the structure associated therewith.
Figure 2B:
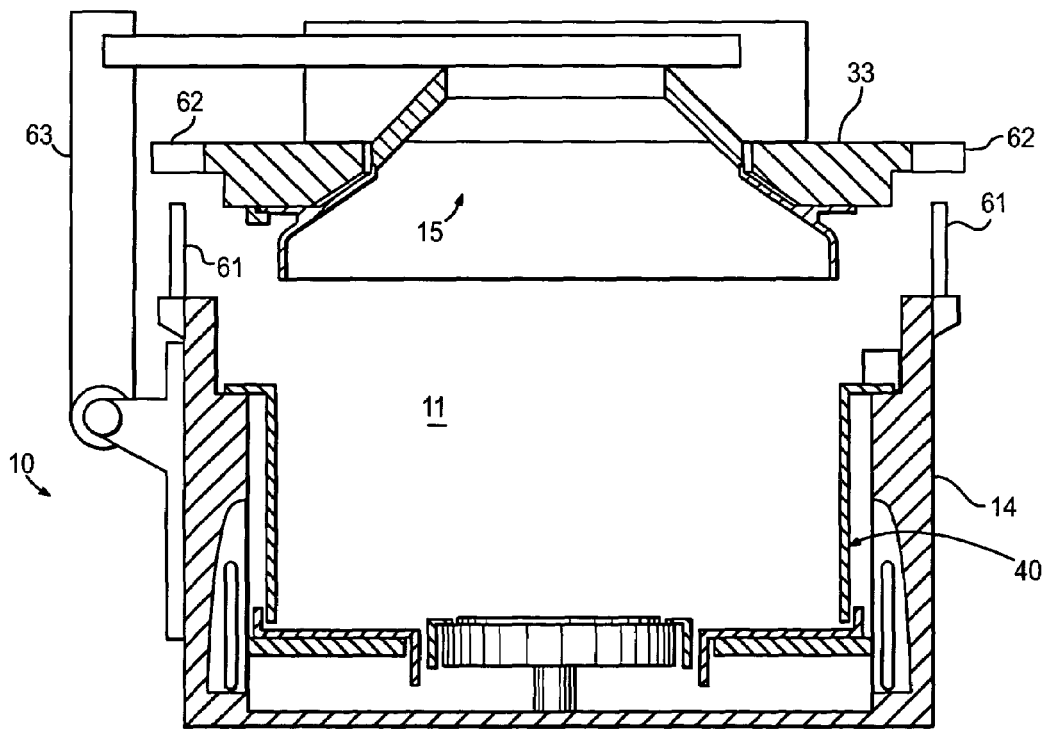
Figure 2C:
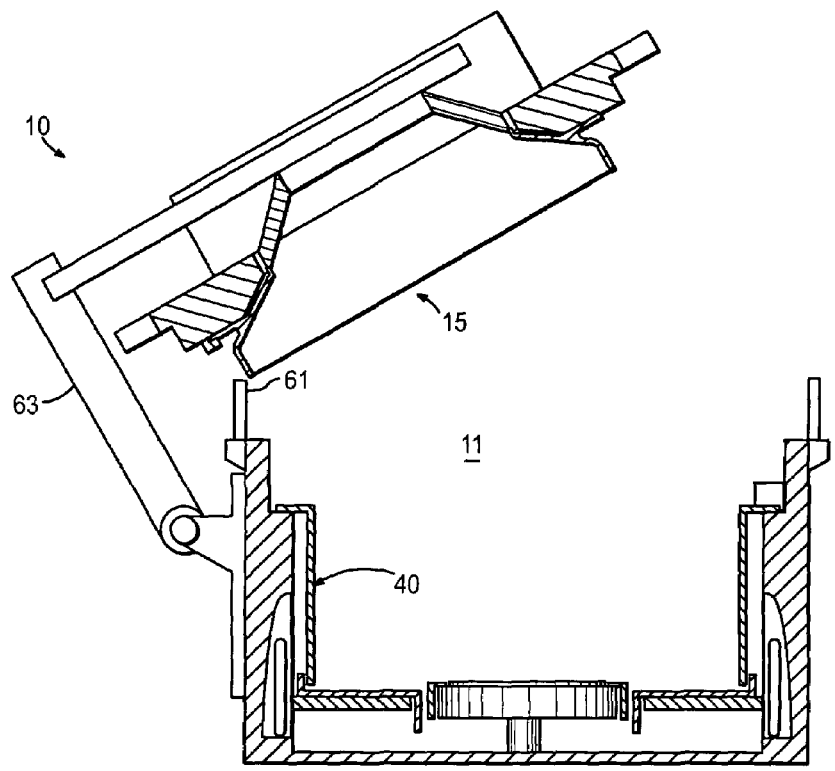
Figure 2D:
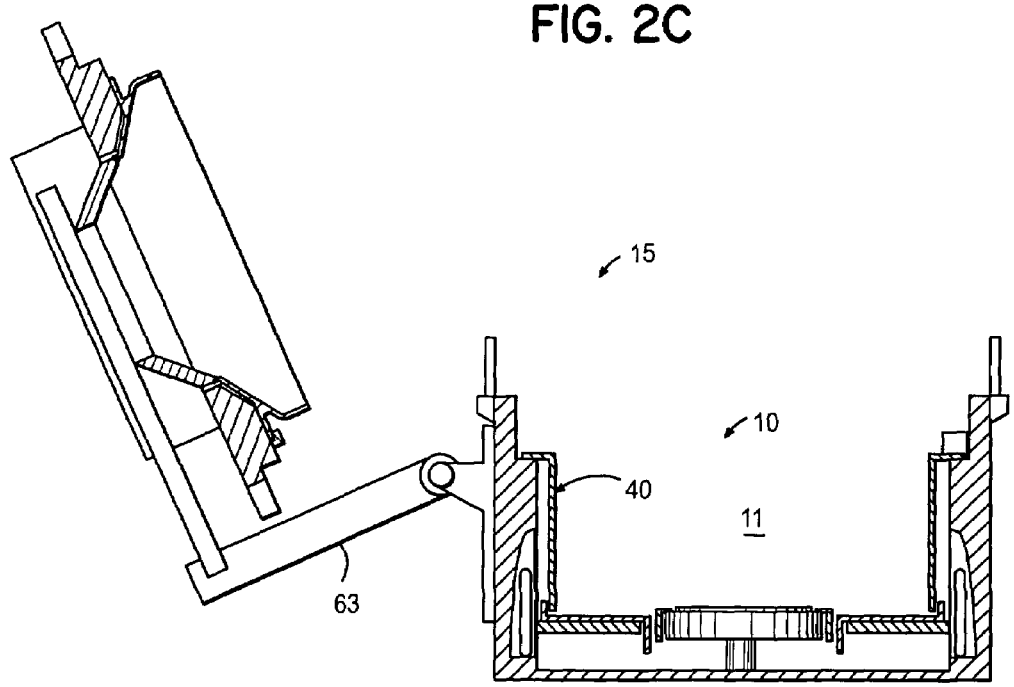
Figure 2E:
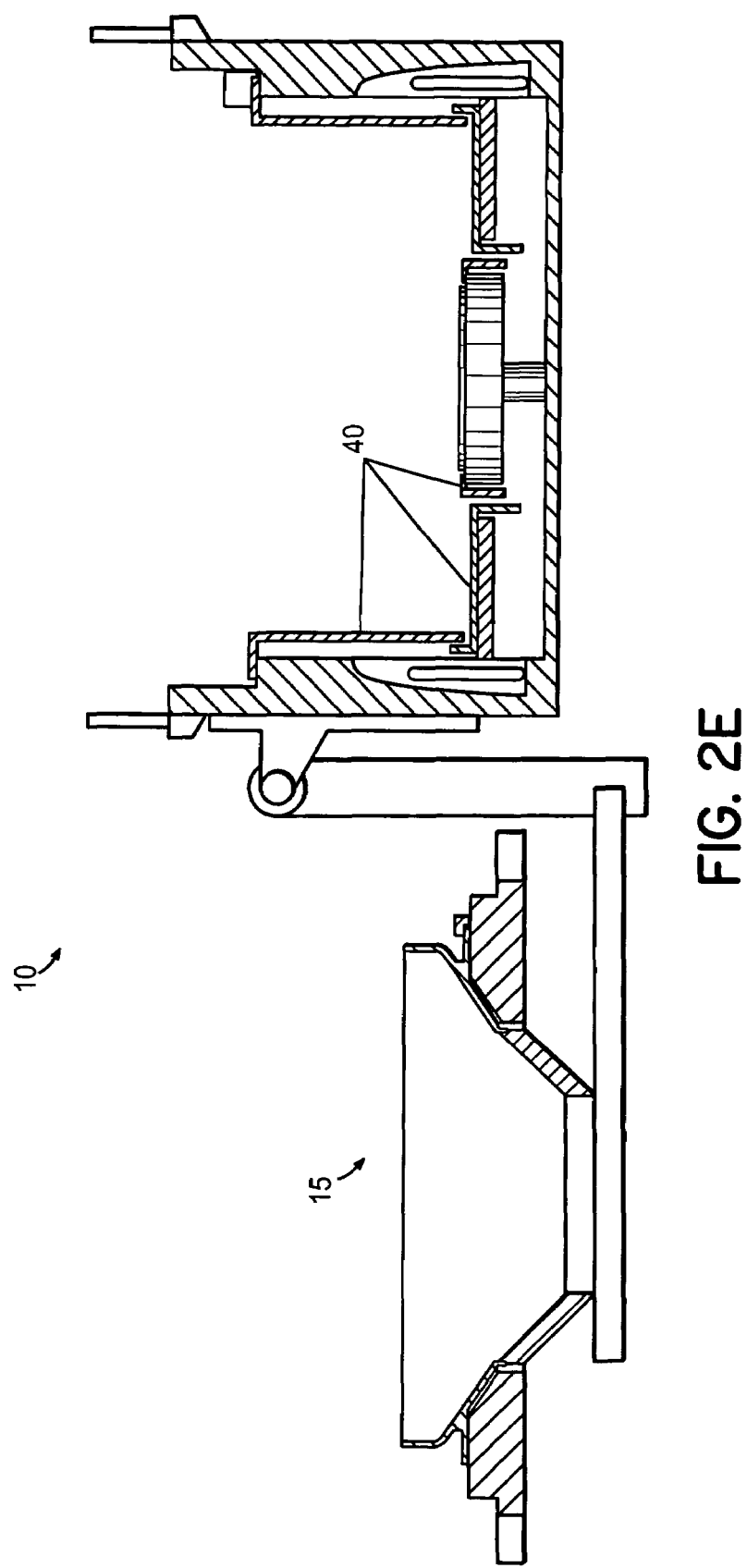

Critical dimensions are accurately established and critical gaps are maintained in the face of potential thermal expansion. As illustrated in FIG. 1B, for example, the upper source shield 42 expands outwardly, as indicated by an arrow 51, as the upper shield 42 rises in temperature. A gap 52 between the outer rim of this upper shield 42 and the barrel shield 41 is established such that the gap 52 is at least as wide as the distance needed to avoid arcing between the shields 41 and 42. Similarly, as illustrated in FIG. 1c, the barrel shield 41 and the lower shield 43 respectively expand as indicated by arrows 53 and 54, as the shields 41 and 43 rise in temperature. Gap 55 between the barrel shield 4a and the lower shield 43 is established such that the gap 55 is at least as wide as the distance needed to avoid arcing between these shields 41 and 43. The lower shield 43 is mounted so as to expand away from barrel shield 41 when heated, so that gap 56 enlarges rather than closes, thereby not causing arcing. Also, a gap 57 (FIG. 1)is maintained between lower shield 43 and susceptor shield 44 that remains sufficiently large upon the heating of the shields to avoid arcing. These gaps 52 and 55–57 are located so that dimensional changes take place where they are less critical, thereby avoiding increased likelihood of arcing.

Arc likelihood is also reduced by the improved control of critical dimensions and critical gaps that the invention provides. These dimensions are preferably improved by more concentric location of the susceptor relative to the chamber as the result of aligning structure that forces improved alignment as the chamber of the apparatus is opened and closed. As illustrated in FIGS. 2A–2E, locating pins 61 on the top rim of the chamber wall 14 align with alignment guides 62 on the top portion 33 of the chamber to provide forced vertical travel of the source and top portion 33 of the chamber relative to the chamber 11. Further, reference or zero registration points (not shown) are provided for the mounting of the chamber shields 41–44 in the positions that will allow minimum change in critical dimensions when the shields are subjected to thermal cycling, as described above. Accordingly, thermally caused dimension changes do not increase the likelihood of arcing.

Figure 3:
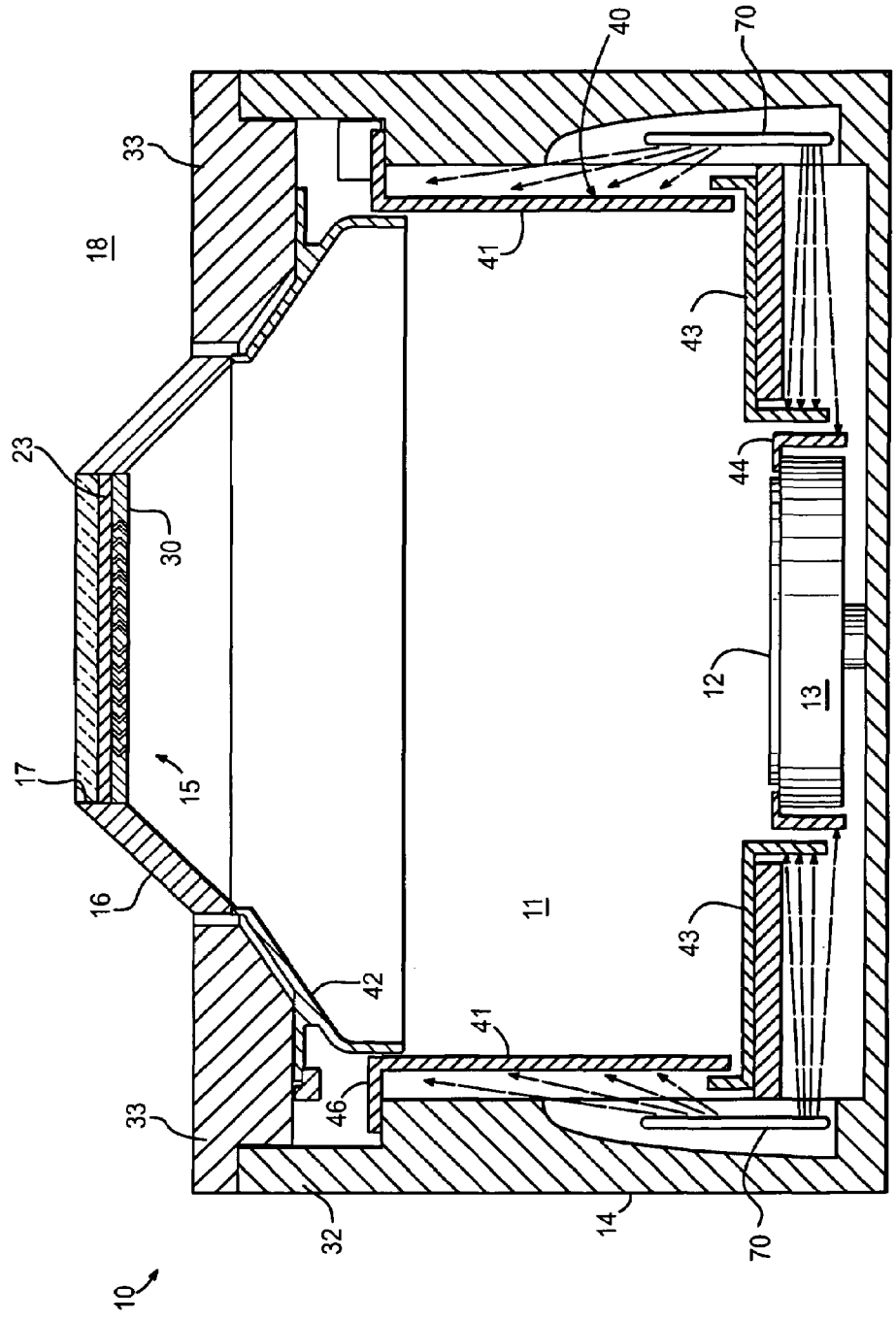
FIG. 3 is a diagram similar to FIG. 1 illustrating the configuration of bake-out lamps in an embodiment of the apparatus.

Referring to FIG. 3, an array of infrared lamps 70 is located so that the lamps 70 uniformly warm chamber shields 41–44 during preheating or operation. The lamps 70 are vertically oriented and generally equally spaced around the axis of the chamber 11, although other spacings that provide acceptable temperature distribution may be used. The lamps 70 are positioned so that radiant energy impinges on all of the shields 41, 43 and 44. During preheating or degassing of the shields, the susceptor 13 is lowered to the position shown so as to expose shield 44 to the lamps 70. The improved thermal conduction of the shields allow them to be heated to higher temperatures without affecting the process. In the illustrated embodiments, vertically or axially oriented quartz lamps expose most of the chamber shield components to thermal radiation. Preheating of the chamber can be carried out with these lamps to minimize the initial shock when the first wafer of a run is processed.

Figure 4B:
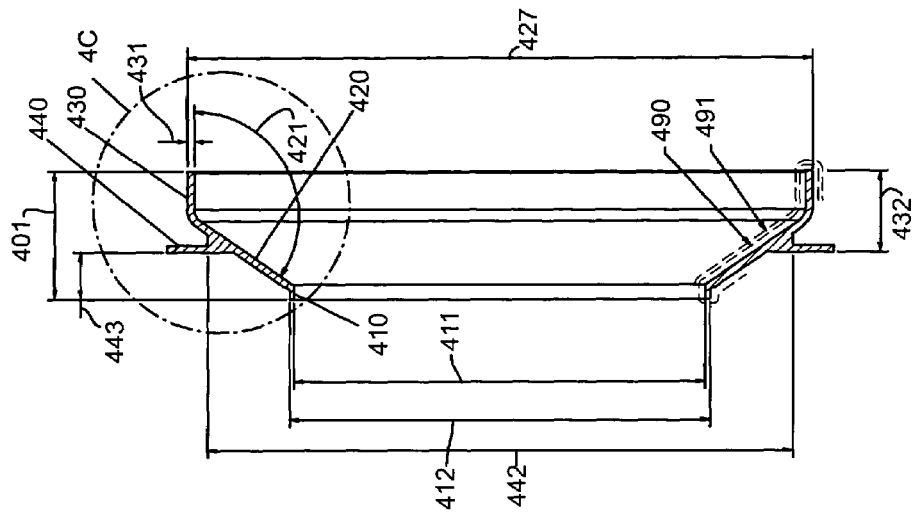
FIGS. 4A–4D show schematic views of an upper source shield in accordance with an embodiment of the invention.
Figure 4A:
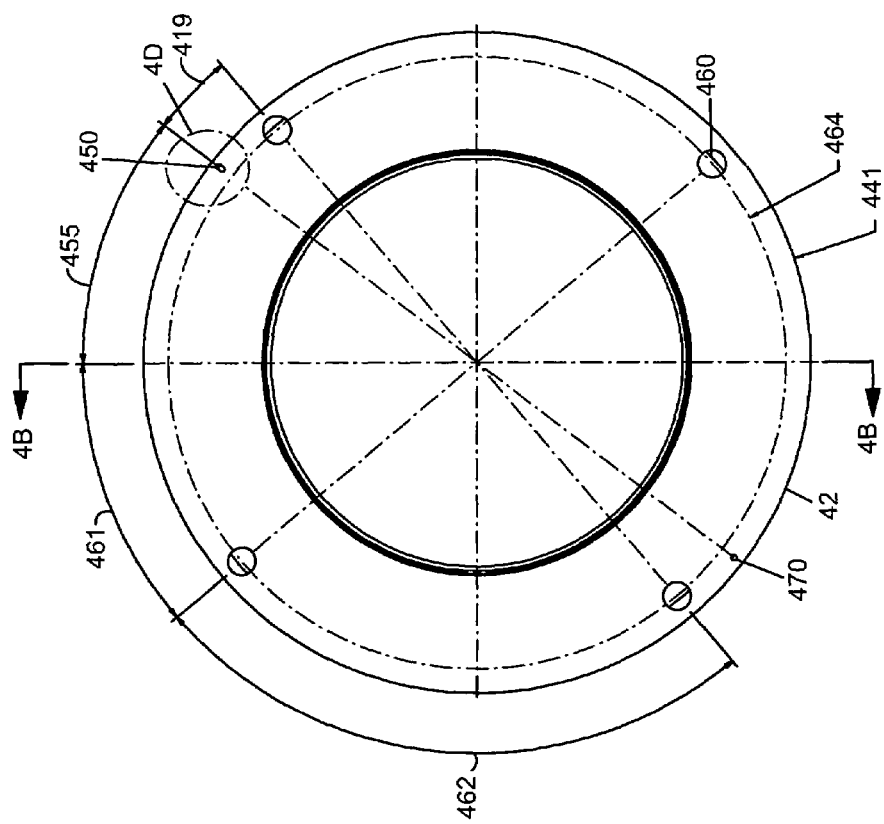
Figure 4C:
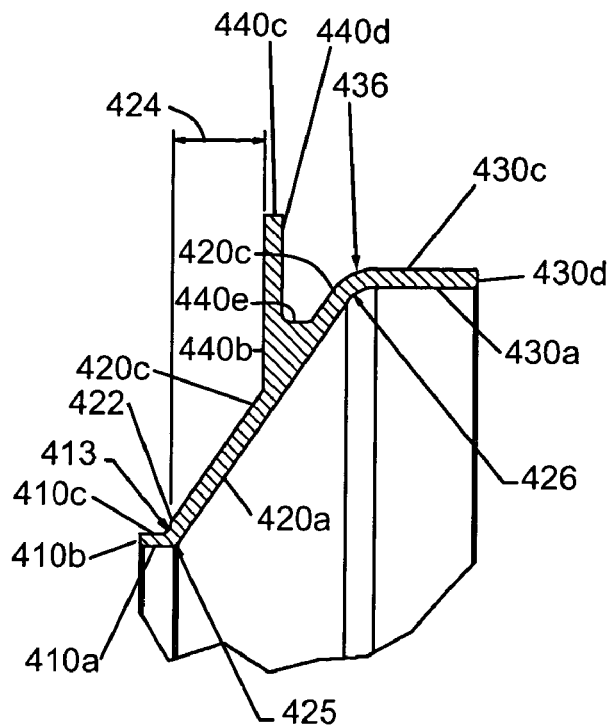
Figure 4D:
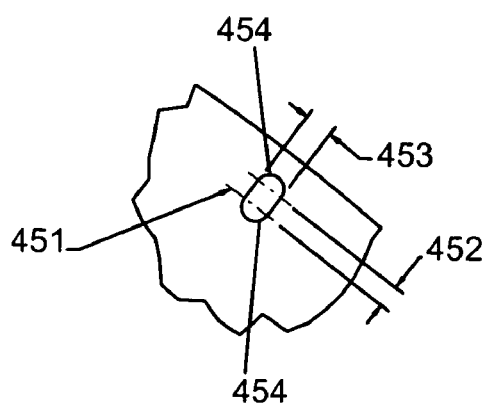

FIGS. 4A–4D show schematic views of an upper source shield in accordance with an embodiment of the invention. FIG. 4A shows a top view; FIG. 4B shows a side view; and FIGS. 4C and 4D show detailed views.

Upper source shield 42 comprises top ring 410, sloped ring 420, bottom ring 430, and mounting element 440. Top ring 410 comprises inner surface 410a, top surface 410b, and an outer surface 410c. Sloped ring 420 comprises an inner surface 420a coupled to the inner surface 410a of the top ring 410, and an outer surface 420c coupled to the outer surface 410c of the top ring 410. Bottom ring 430 comprises inner surface 430a coupled to the inner surface 420a of the sloped ring 420, an outer surface 430c coupled to the outer surface 420c of sloped ring 420, and a bottom surface 430d coupled to the inner surface 430a and the outer surface 430c. Mounting element 440 comprises a mating surface 440b coupled to the outer surface 420c of the sloped ring 420, an outer surface 440c coupled to the mating surface 440b and the bottom surface 440d of the mounting element 440, and a lower surface 440e coupled to the bottom surface 440d of the mounting element 440 and the outer surface 430c of bottom ring 430.

Upper source shield 42 can be fabricated from a single block of material. For example, aluminum (6061-T6) can be used. Alternately, other materials can be used, and more than one piece can be used. Upper source shield 42 comprises a height 401. For example, height 401 can be at least approximately 116.4 mm.

Mounting element 440 can comprise a number of through-holes 460 extending from the mating surface 440b to the bottom surface 440d. For example, holes 460 can have a diameter of at least approximately 25.4 mm. Holes 460 can have angular displacements 461 and 462 of approximately 40.3 degrees and approximately 90 degrees. Holes 460 can be located on a circle 464 having a diameter of approximately 560 mm. Mounting element 440 can comprise at least one slot 450 extending from the mating surface 440b to the bottom surface 440d. For example, slot 450 can be located on a circle 451 having a diameter of approximately 584.7 mm. Slot 450 can have angular displacements 455 of approximately 37.5 degrees. In addition, slot can have a length 452 of at least approximately 4 mm, a width 453 of at least approximately 5 mm, and have curved ends 454 having radiuses of at least approximately 2.45 mm. Furthermore, mounting element 440 can comprise at least one hole 470 extending from the mating surface 440b to the bottom surface 440d. For example, hole 470 can be located on a circle having a diameter of at least approximately 586.7 mm. Hole 470 can have a diameter of approximately 5 mm.

Top ring 410 can have an inside diameter 411 of at least approximately 372.8 mm and an outside diameter 412 of at least approximately 380.9 mm. Top ring 410 can further comprise an angular feature 413 having a slope of approximately 45 degrees and a length of at least approximately 1.5 mm.

Sloped ring 420 has an angular displacement 421 of approximately 124.5 degrees. The outer surface 420c of the sloped ring 420 can comprise a flat surface 422 which can be located at a distance 424 of at least approximately 32.1 mm above the mating surface 440b of the mounting element 440. Inner surface 420a can be coupled to the inner surface 410a of the top ring 410 using a curved surface 425 having a radius of approximately 1.5 mm, and to inner surface 430a of the bottom ring 430 using a curved surface 426 having a radius of at least approximately 12.7 mm. Lower surface 440e can have an outside diameter 442 of at least approximately 530.0 mm.

Bottom ring 430 can have an outside diameter 427 of approximately 567 mm and a thickness 413 of at least approximately 6.3 mm. Bottom surface 430d of bottom ring 430 can be located a distance 432 from the mating surface 440b and the distance 432 be at least approximately 74 mm. Outer surface 430c can be coupled to the outer surface 420c of the sloped ring 420 using a curved surface 436 having a radius of at least approximately 19.0 mm.

Mounting element 440 can have an outside diameter 441 of at least approximately 605.0 mm. Top surface 410b of top ring 410 can be located a distance 443 from the mating surface 440b and the distance 443 can be at least approximately 42.4 mm. Mounting element 440 can have a thickness of at least approximately 6.3 mm.

Inner surface 410a, top surface 410b, and at least a portion of an outer surface 410c of top ring 410 can be grit blasted 490. In addition, inner surface 420a of sloped ring 420 can be grit blasted. Inner surface 430a, outer surface 430c, and bottom surface 430d of bottom ring 430 can be grit blasted. Furthermore, inner surface 420a of sloped ring port 420, and the inner surface 430a, outer surface 430c, and bottom surface 430d of bottom ring 430 can be arc sprayed 491. For example, arc spray can comprise a twin wire arc spray using aluminum per specification 115-01-148. In alternate embodiments, other surfaces can be grit blasted, and other surfaces can be arc sprayed.

Figure 5C:
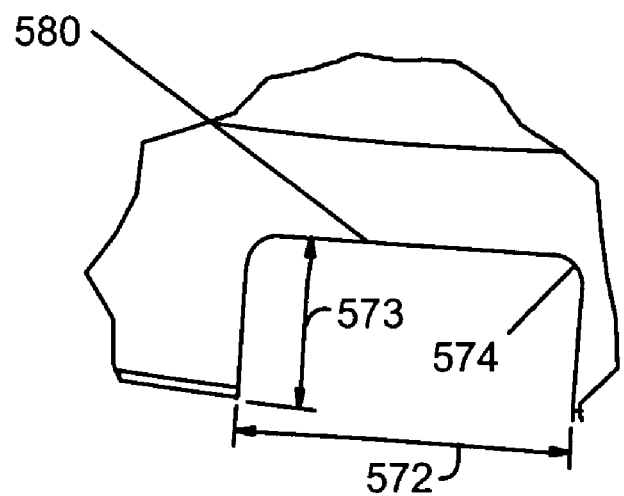
Figure 5D:
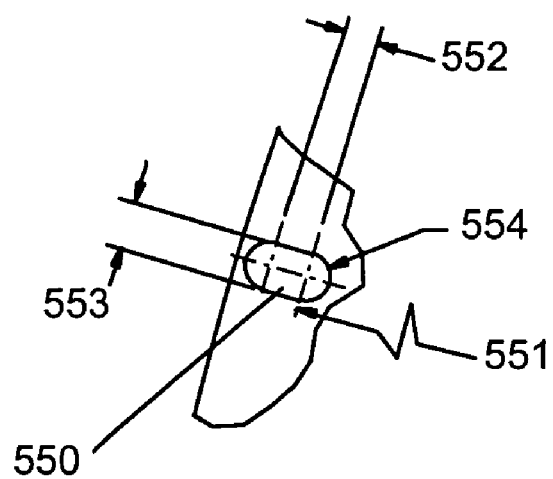
Figure 6B:
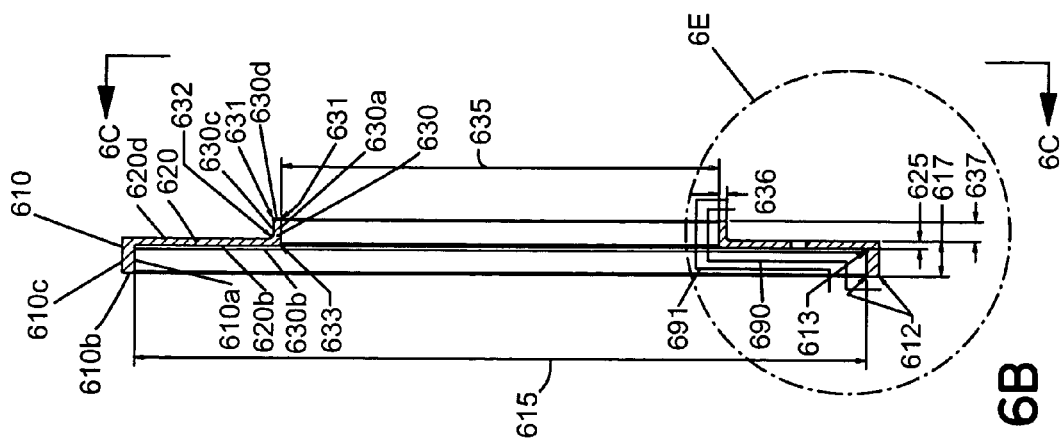
FIGS. 6A–6D show schematic views of a lower shield in accordance with an embodiment of the invention.
Figure 6A:
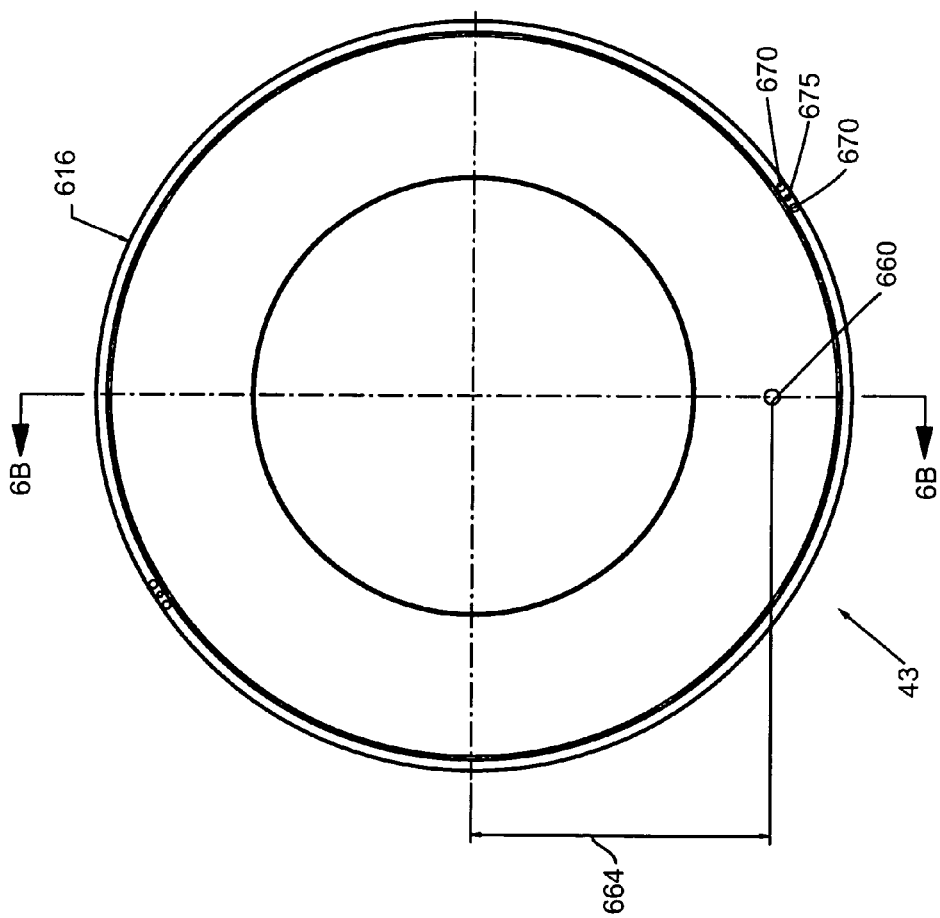
Figure 6C:
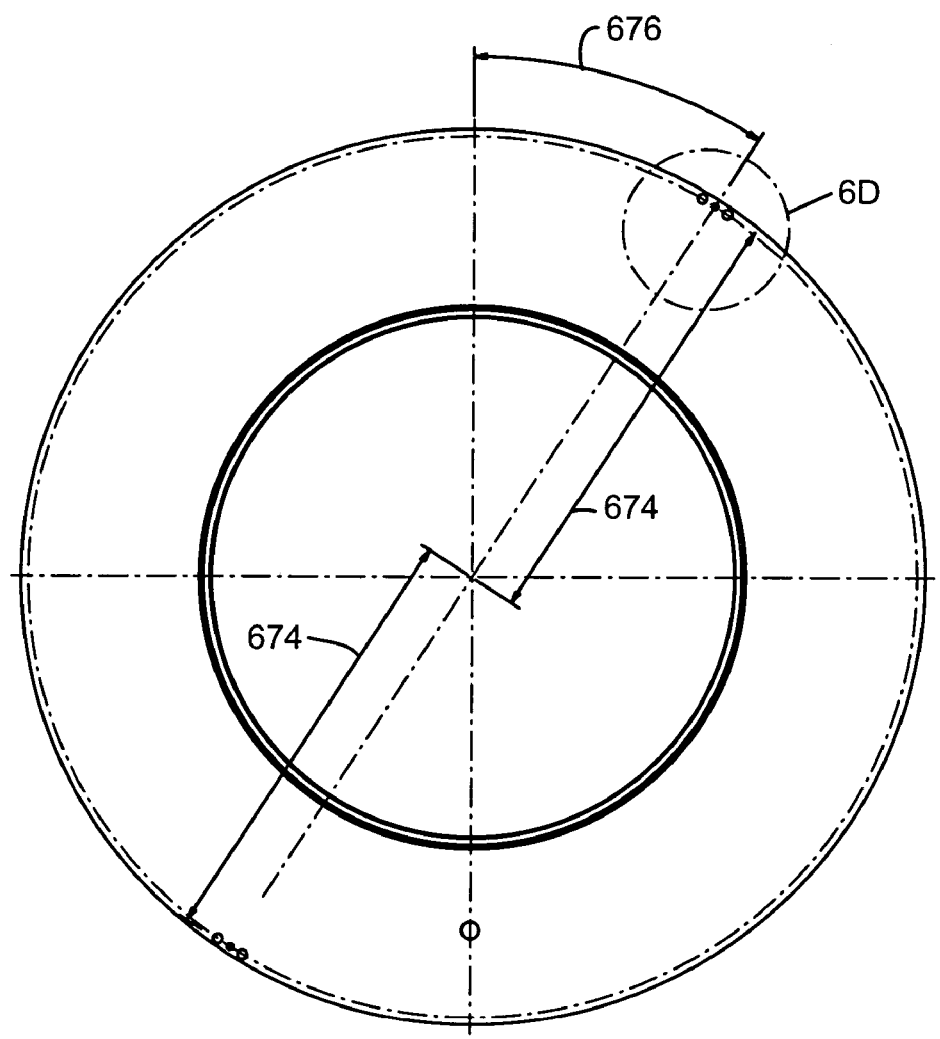
Figure 6D:
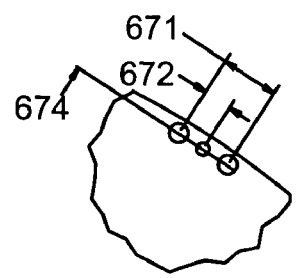
Figure 7B:
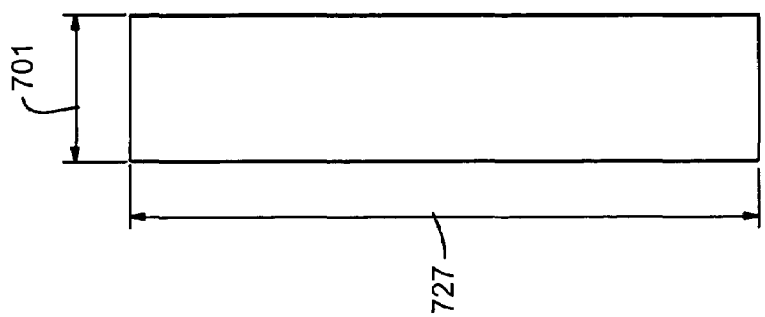
FIGS. 7A–7E show schematic views of a table shield in accordance with an embodiment of the invention.
Figure 7A:
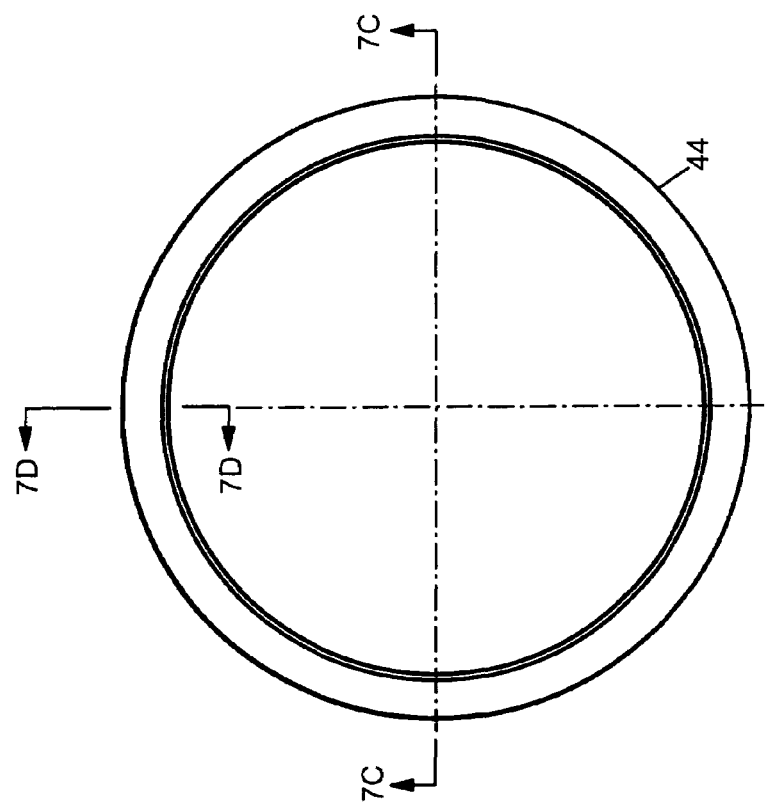
Figure 7C:
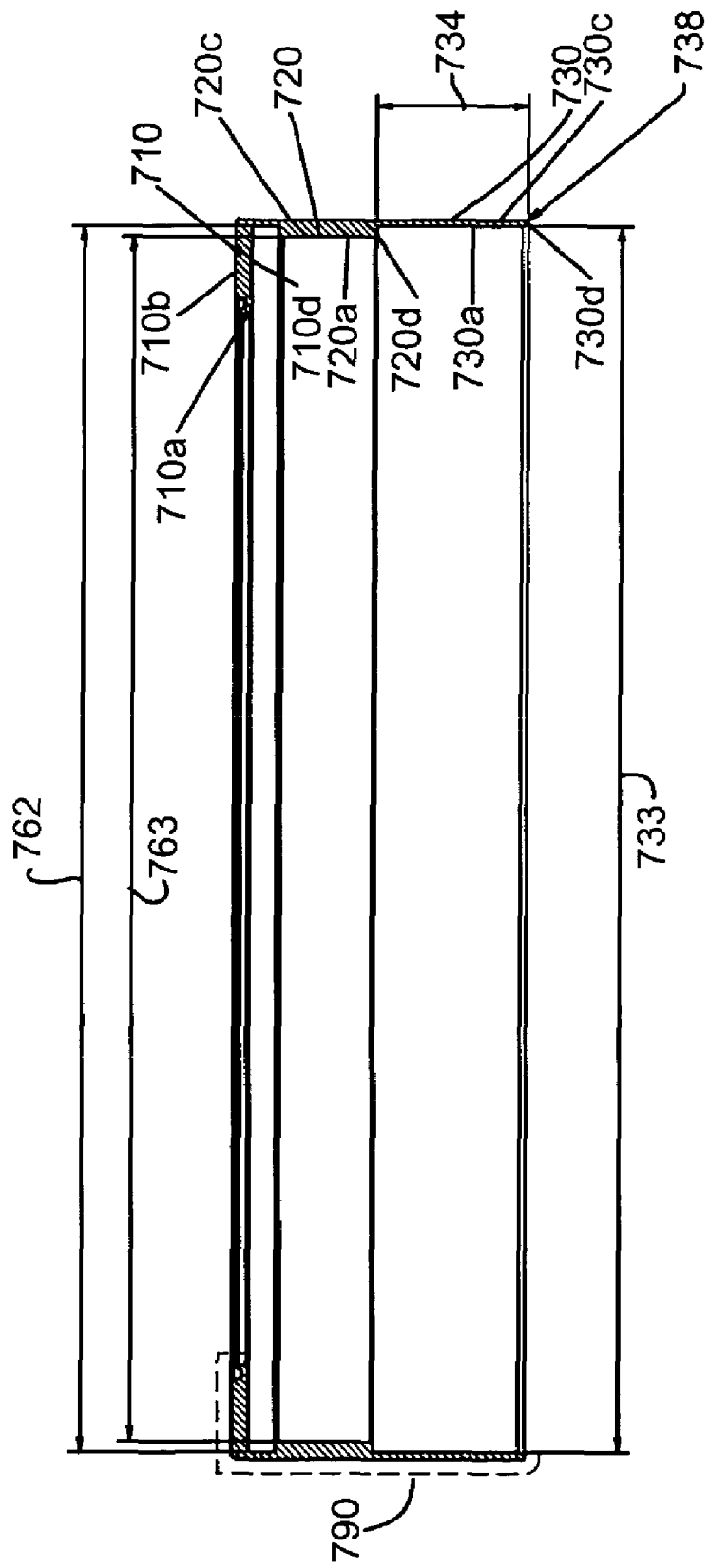
Figure 7D:
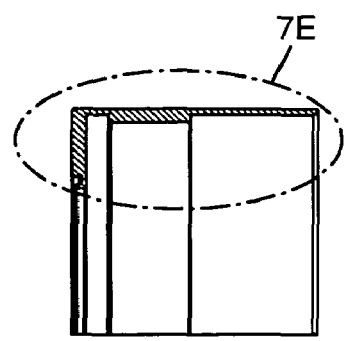
Figure 7E:
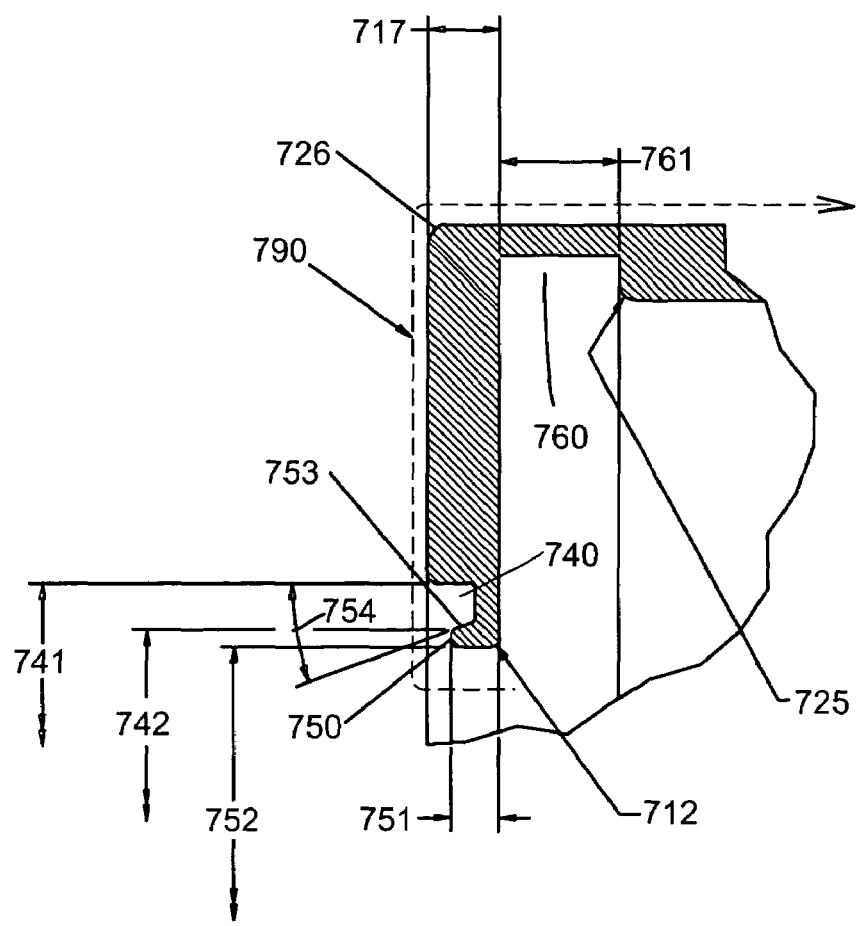

FIGS. 5A–5D show schematic views of a barrel shield in accordance with an embodiment of the invention. FIG. 5A shows a top view; FIG. 5B shows a side view; and FIGS. 5C and 5D show detailed views.

Barrel shield 41 comprises flange 510, and body portion 520. Flange 510 comprises a top surface 510b, an outer surface 510c, and a mating surface 510d. Body portion 520 comprises an inner surface 520a coupled to the top surface 510b of flange 510, an outer surface 520c coupled to the mating surface 510d of flange 510, and a bottom surface 520d coupled to the outer surface 520c and the inner surface 520a.

Inner surface 520a of the body portion 520 can be coupled to the top surface 510b of the flange 510 using a curved surface 512 have a radius of approximately 9.0 mm.

Flange 510 can comprise a number of through-holes 560 extending from the top surface 510b to the bottom surface 510d. For example, holes 560 can have a diameter of at least approximately 0.8 mm. Holes 560 can have angular displacements 555, 561 and 562 of approximately 16.3 degrees, approximately 21.2 degrees, and approximately 90 degrees, respectively. Holes 560 can be located on a circle 564 having a diameter of approximately 634 mm.

Flange 510 can comprise at least one slot 550 extending from the top surface 510b to the bottom surface 510d. For example, slot 550 can be located on a circle 551 having a diameter of at least approximately 630 mm. Slot 550 can have angular displacements 555 of at least approximately 16.3 degrees. In addition, slot 550 can have a length 552 of at least approximately 4 mm, a width 553 of at least approximately 4.9 mm, and have curved ends 554 having radiuses of at least approximately 2.45 mm. Furthermore, flange 510 can comprise at least one alignment hole 570 extending from the top surface 510b to the bottom surface 510d. For example, alignment hole 570 can be located on a circle 564 having a diameter of approximately 634 mm. Alignment hole 570 can have a diameter of at least approximately 4.9 mm.

Flange 510 can comprise at least one cutout 530 extending from the top surface 510b to the bottom surface 510d. For example, cutout 530 can be located on the outer edge of flange 510. Cutouts 530 can have angular displacements 534 and 535 of approximately 5 degrees and approximately 45 degrees. In addition, cutout 530 can have a length 532 of approximately 30.0 mm, and a depth 533 of approximately 14.9 mm.

Flange 510 can comprise at least one alignment feature 580 extending from the top surface 510b to the bottom surface 510d. For example, alignment feature 580 can be located on the outer edge of flange 510. Alignment feature 580 can have a length 572 of approximately 30.0 mm, a depth 573 of approximately 17.9 mm, and can have rounded corners 574 having radiuses of approximately 3.15 mm. Alignment feature 580 can have an angular displacement 586 of approximately 3.5 degrees.

Inner surface 520a, bottom surface 520d, at least a portion of an outer surface 520c of the body portion 520 and at least a portion of a top surface 510b of flange 510 can be grit blasted 590. Furthermore, inner surface 520a, bottom surface 520d, at least a portion of an outer surface 520c of the body portion 526 and at least a portion of a top surface 510b of flange 510 can be arc sprayed 591. For example, arc spray can comprise a twin wire arc spray using aluminum per specification 115-01-148. In alternate embodiments, other surfaces can be grit blasted, and other surfaces can be arc sprayed.

FIGS. 6A–6D show schematic views of a lower shield in accordance with an embodiment of the invention. Lower shield 43 comprises top ring 610, body portion 620, and bottom ring 630. Top ring 610 comprises inner surface 610a, top surface 610b, and an outer surface 610c. Body portion 620 comprises a top surface 620b coupled to the inner surface 610a of top ring 610 and to the inner surface 630a of bottom ring 630, an outer surface 620c coupled to the outer surface 610c of top ring 610 and to the outer surface 630c of bottom ring 630. Bottom ring 630 comprises a bottom surface 630d coupled to the inner surface 630a and the outer surface 630c.

Body portion 620 can comprise at least one through-hole 660 extending from the top surface 620b to the bottom surface 620d. For example, hole 660 can have a diameter of approximately 12.0 mm. Hole 660 can be located on a circle 664 having a radius of approximately 241.5 mm.

Top ring 610 can comprise rounded edges 612 having radiuses of at least approximately 1.0 mm. Bottom ring 630 can comprise rounded edges 631 having radiuses of at least approximately 1.0 mm. Top ring 610 can be coupled to body portion 620 using rounded corners 613 having radiuses of at least approximately 2.5 mm. Bottom ring 630 can be coupled to body portion 620 using rounded corners 632 having radiuses of at least approximately 2.0 mm and rounded edges 633 having radiuses of at least approximately 2.0 mm.

Top ring 610 can comprise a number of holes 670. For example, holes 670 can be located on a circle 674 having a radius of at least approximately 301.3 mm. Holes 670 can have a diameter of at least approximately 6.5 mm. Top ring 610 can comprise a number of through-holes 675. For example, holes 675 can be located on a circle 674 having a radius of approximately 301.3 mm. Holes 675 can have a diameter of approximately 4.3 mm. Holes 675 can have an angular displacement 676 of approximately 32.8 degrees. Holes 670 can be spaced apart at a distance 671 of approximately 20.0 mm and can be spaced from hole 675 at a distance 672 of approximately 10.0 mm.

Top ring 610 can have an inside diameter 615 of approximately 592.7 mm and an outside diameter 616 of approximately 612.7 mm. Bottom ring 630 can have an inside diameter 635 of approximately 355.0 mm and a thickness 636 of approximately 6.3 mm.

Top ring 610 can have a height 617 of approximately 28.6 mm. Body portion 620 can have a thickness of approximately 6.3 mm. Bottom ring 630 can have a height 637 of approximately 15.8 mm.

In one embodiment, lower shield 43 comprises a single block of material. For example, lower shield 43 can be fabricated as a block of material such as aluminum (6061-T6). Alternately, lower shield 43 can comprise a different conductive material.

Inner surface 610a, top surface 610b, top surface 620b, at least a portion of the bottom surface 620d of body portion 620, the interior surfaces of hole 660 and inner surface 630a and the bottom surface 630d of the bottom ring 630 can be grit blasted 690. Furthermore, inner surface 610a, at least a portion of the bottom surface 620d of body portion 620, and the interior surfaces of hole 660, and the bottom surface 630d of the bottom ring 630 can be arc sprayed 691. For example, arc spray can comprise a twin wire arc spray using aluminum per specification 115-01-148. In alternate embodiments, other surfaces can be grit blasted, and other surfaces can be arc sprayed.

FIGS. 7A–7E show schematic views of a susceptor shield in accordance with an embodiment of the invention. Susceptor shield 44 comprises top ring 710, body portion 720, and bottom ring 730. Top ring 710 comprises inner surface 710a, top surface 710b, and a bottom surface 710d. Body portion 720 comprises an inner surface 720a coupled to the bottom surface 710d of top ring 710 and to the bottom surface 720d of body portion 720, and an outer surface 720c coupled to the outer surface 730c of bottom ring 730 and to the top surface 710b of top ring 710. Bottom ring 730 comprises a bottom surface 730d coupled to the inner surface 730a and the outer surface 730c. Inner surface 730a of bottom ring 730 is coupled to the bottom surface 720d of body portion 720.

Top ring 710 comprises a thickness 717 of approximately 4.5 mm, and an inside diameter 752 of approximately 298.0 mm. Top ring 710 comprises an annular groove 740 having a depth of approximately 3.0 mm, an outside diameter 741 of approximately 306.0 mm, and an inside diameter 742 of approximately 300.0 mm. Top ring 710 comprises an annular step 750 having a height 751 of approximately 3.0 mm, an outside diameter 742 of approximately 300.0 mm, an inside diameter 752 of approximately 298.0 mm, and a sloped face 753 having a slope 754 of approximately 20 degrees.

Body portion 720 comprises an outside diameter 727 of approximately 351.0 mm, and an inside diameter 763 of approximately 341.5 mm. Body portion 720 comprises an annular groove 760 having a length 761 of approximately 7.5 mm, an outside diameter 762 of approximately 347.0 mm, and an inside diameter 763 of approximately 341.5 mm.

Bottom ring 730 comprises a height of approximately 42.5 mm, an outside diameter 727 of approximately 351.0 mm, and an inside diameter 733 of approximately 347.0 mm.

Top ring 710 can comprise rounded edges 612 having radiuses of approximately 10.5 mm. Body portion 720 can comprise rounded edges 725 having radiuses of approximately 1.0 mm. Top ring 710 can be coupled to body portion 720 using rounded corners 726 having radiuses of approximately 1.0 mm. Bottom ring 730 can comprise sloped edges 738 having slopes of approximately 30 degrees.

In one embodiment, table-shield susceptor shield 44 comprises a single block of material. For example, lower shield 43 can be fabricated as a block of material such as stainless steel (316L). Table shield 44 comprises a height 701 of approximately 82.0 mm. Alternately, table shield 44 can comprise a different conductive material and have a different height. Outer surface 720c, outer surface 730c, top surface 710b, inner surface 710a, and at least a portion of the bottom surface 730d of bottom ring 730 can be grit blasted 790. For example, grit blast can comprise providing a minimum 4–5 micrometer roughness average (Ra) over the surfaces.

Fabrication of each shield can further comprise at least one of providing a surface anodization on one or more surfaces, providing a spray coating on one or more surfaces, or subjecting one or more surfaces to plasma electrolytic oxidation. For example, the spray coating can comprise at least one of $Al_2O_3$, Yttria ($Y_2O_3$), $Sc_2O_3$, $Sc_2F_3$, $YF_3$, $La_2O_3$, $CeO_2$, $Eu_2O_3$, and $DyO_3$. Methods of processing metal components and applying spray coatings are well known to those skilled in the art of surface material treatment.

Those skilled in the art will appreciate that the application of the present invention herein is varied, that the invention is described in exemplary embodiments, and that additions and modifications can be made without departing from the principles of the invention.

The invention claimed is:

1. An upper source shield configured to surround a material source and energy source in a removable top portion of a cooled and grounded chamber wall of a semiconductor processing apparatus for protecting said top portion from deposition, comprising:

an integral, annular metal element having at least four annular portions including a cylindrical top ring, a frusto-conical sloped ring, a cylindrical bottom ring, and a generally planar mounting element;

the frusto-conical sloped ring having an upper smaller end contiguous with the top ring and a larger lower larger end contiguous with the bottom ring;

each of the rings having an inner surface and an outer surface;

a continuous inner surface formed of the inner surfaces of said top, sloped and bottom rings, and an outer surface formed of the outer surfaces of said top, sloped and bottom rings; and the mounting element is disposed on the outer surface of the sloped ring and having a bottom surface contiguous with a lower portion of the outer surface of the sloped ring and a mating surface contiguous with an upper portion of the outer surface of the sloped ring and configured to form intimate thermal contact and electrical contact with the removable top portion of the cooled and grounded chamber wall and to support the annular element on the chamber wall.

2. A chamber shield assembly for a semiconductor-wafer vacuum processing apparatus comprising a plurality of shields including the upper source shield of claim 1, wherein:

each of the plurality of shields is made of high thermal conductivity material to provide high thermal conductivity throughout each shield;

each shield has a mounting surface configured to provide intimate thermal contact with the wall of a chamber of the apparatus when secured thereto, the mounting surface having sufficient area to provide high thermal conductivity between the shield and the wall of the chamber.

3. The shield assembly of claim 2, wherein:

the shields have a common axis and generally circular, annular cross sections in planes perpendicular to the axis; and the mounting surfaces having an area that provides the intimate thermal contact that is at least as large as the area of the cross sections of the respective shields.

4. The shield assembly of claim 2, wherein:

the mounting surfaces provide a thermal conductivity between the shields and the chamber wall that is at least as great as the thermal conductivity across said cross sections of the respective shields.

5. The shield assembly of claim 4, wherein:

the shields are configured to mount in a cooperating relationship, when installed in the chamber, out of contact with each other and spaced by gaps sufficient to avoid arcing; and the gaps are dimensioned, and the mounting surfaces are located in relation to the gaps, such that the gaps remain sufficient to avoid arcing during any likely thermal expansion of the shields.

6. The shield assembly of claim 2, wherein:

the shields are configured to mount in a cooperating relationship, when installed in the chamber, out of contact with each other and spaced by gaps sufficient to avoid arcing; and the gaps are dimensioned, and the mounting surfaces are located in relation to the gaps, such that the gaps remain sufficient to avoid arcing during any likely thermal expansion of the shields.

7. A wafer processing apparatus comprising:

a vacuum chamber bounded by a temperature controlled chamber wall;

a chamber shield assembly according to claim 2.

8. The apparatus of claim wherein:

the shields have a common axis and generally circular, annular cross sections in planes perpendicular to the axis; and the mounting surfaces having an area that provides the intimate thermal contact that is at least as large as the area of the cross sections of the respective shields.

9. The apparatus of claim 8 wherein:

the mounting surfaces provide a thermal conductivity between the shields and the chamber wall that is at least as great as the thermal conductivity across said cross sections of the respective shields.

10. The apparatus of clai wherein:

the shields are mounted in a cooperating relationship, out of contact with each other and spaced by gaps sufficient to avoid arcing; and the gaps are dimensioned, and the mounting surfaces are located in relation to the gaps, such that the gaps remain sufficient to avoid arcing during any likely thermal expansion of the shields.

11. The apparatus of claim 7 wherein:

the shields are mounted in a cooperating relationship, out of contact with each other and spaced by gaps sufficient to avoid arcing; and the gaps are dimensioned, and the mounting surfaces are located in relation to the gaps, such that the gaps remain sufficient to avoid arcing during any likely thermal expansion of the shields.

12. The apparatus of claim 11 further comprising:

cooperating alignment structure on the shields and on the chamber wall configured to locate the shields in the cooperating relationship when installed in the chamber.

13. The apparatus of claim 7 further comprising:

an array of radiant heaters spaced around the chamber so as to enable the direction of radiant heating onto extended surfaces of a plurality of the shields of the assembly.

14. The apparatus of claim 7 further comprising:

an array of radiant lamps oriented parallel to the axis of the chamber and spaced around the chamber so as to enable the direction of radiant heating onto extended surfaces of a plurality of the shields of the assembly.

15. The upper source shield as claimed in claim 1, wherein the annular element is fabricated from a single block of material.

16. The upper source shield as claimed in claim 15, wherein the material is aluminum (6061-T6).

17. The upper source shield as claimed in claim 15, wherein the inner surface of the sloped ring portion, and the inner surface, the outer surface, and the bottom surface of bottom ring are arc sprayed.

18. The upper source shield as claimed in claim 15, wherein the inner surface of the sloped ring, and the inner surface, the outer surface, and the bottom surface of the bottom ring are coated using at least one of $Al_2O_3$, Yttria ($Y_2O_3$), $Sc_2O_3$, $Sc_2F_3$, $YF_3$, $La_2O_3$, $CeO_2$, $Eu_2O_3$, and $DyO_3$.

19. The upper source shield as claimed in claim 1, wherein the upper source shield comprises a height of at least approximately 116.4 mm.

20. The upper source shield as claimed in claim 1, wherein the mounting element comprises at least one slot extending from the mating surface to the bottom surface, wherein the slot is located on a circle having a diameter of approximately 584.7 mm and has an angular displacement of approximately 37.5 degrees.

21. The upper source shield as claimed in claim 20, wherein the slot has a length of at least approximately 4 mm, and a width of at least approximately 5 mm.

22. The upper source shield as claimed in claim 1, wherein the mounting element comprises at least one hole extending from the mating surface to the bottom surface, wherein the hole is located on a circle having a diameter of at least approximately 586.7 mm and has a diameter of approximately 5 mm.

23. The upper source shield as claimed in claim 1, wherein the top ring comprises an inside diameter of at least approximately 372.8 mm and an outside diameter of at least approximately 380.9 mm.

24. The upper source shield as claimed in claim 1, wherein the sloped ring comprises an angular displacement of approximately 124.5 degrees.

25. The upper source shield as claimed in claim 1, wherein the bottom ring comprises an outside diameter of approximately 567 mm and a thickness of at least approximately 6.3 mm.

26. The upper source shield as claimed in claim 1, wherein the mounting element comprises an outside diameter of at least approximately 605.0 mm and a thickness of at least approximately 6.3 mm.

27. The upper source shield as claimed in claim 15, wherein the inner surface, the top surface, and at least a portion of an outer surface of top ring; the inner surface of the sloped ring; and the inner surface, the outer surface, and the bottom surface of the bottom ring are grit blasted.

* * * * *

UNITED STATES PATENT AND TRADEMARK OFFICE
CERTIFICATE OF CORRECTION

| | |
|---|---|
| PATENT NO. | : 7,182,816 B2 |
| APPLICATION NO. | : 10/643136 |
| DATED | : February 27, 2007 |
| INVENTOR(S) | : Mark Kleshock et al. |

It is certified that error appears in the above-identified patent and that said Letters Patent is hereby corrected as shown below:

Column 6, line 63, reads "In addition, slot can have a" and should read --In addition, slot 450 can have a--

Column 10, lines 59-60, CLAIM 1, reads "and a larger lower larger end contiguous with" and should read --and a larger lower end contiguous with --

Signed and Sealed this

Seventh Day of August, 2007

JON W. DUDAS
*Director of the United States Patent and Trademark Office*